(12) United States Patent
Uchikawa (10) Patent No.: US 8,739,005 B2
(45) Date of Patent: May 27, 2014

(54) ERROR CORRECTION ENCODING APPARATUS, ERROR CORRECTION DECODING APPARATUS, NONVOLATILE SEMICONDUCTOR MEMORY SYSTEM, AND PARITY CHECK MATRIX GENERATION METHOD

(75) Inventor: Hironori Uchikawa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 234 days.

(21) Appl. No.: 13/406,808

(22) Filed: Feb. 28, 2012

(65) Prior Publication Data

US 2013/0055050 A1   Feb. 28, 2013

(30) Foreign Application Priority Data

Aug. 24, 2011  (JP) .................................. 2011-182633

(51) Int. Cl.
*H03M 13/09*     (2006.01)
(52) U.S. Cl.
USPC ........................................................ 714/781
(58) Field of Classification Search
USPC ........................................................ 714/781
See application file for complete search history.

(56) References Cited

U.S. PATENT DOCUMENTS

2008/0077839 A1* 3/2008 Gross et al. .................... 714/755
2008/0244368 A1* 10/2008 Chin et al. ..................... 714/800
2011/0252283 A1* 10/2011 Mokhlesi et al. .............. 714/719

FOREIGN PATENT DOCUMENTS

JP        2007-288721 A      11/2007

OTHER PUBLICATIONS

R. Smarandache et al; Quasi-Cyclic LDPC Codes: Influence of Proto- and Tanner-Graph Structure on Minimum Hamming Distance Upper Bounds; IEEE Trans. Jan. 2009; pp. 1-19.
Xial-Yu Hu et al; Progressive Edge-Growth Tanner Graphs; IEEE; 2001, pp. 995-1001.

* cited by examiner

*Primary Examiner* — Ajay Bhatia
*Assistant Examiner* — Thien D Nguyen
(74) *Attorney, Agent, or Firm* — Holtz, Holtz, Goodman & Chick, PC (57) ABSTRACT

According to one embodiment, an error correction encoding apparatus includes a linear encoder and a low-density parity check (LDPC) encoder. The linear encoder supports a linear coding scheme enabling a parity check to be carried out by a division using a generating polynomial and applies the generating polynomial to input data to obtain linear coded data. The LDPC encoder applies a generator matrix corresponding to a parity check matrix for an LDPC code to the linear coded data to obtain output data. The parity check matrix satisfies Expression (1) shown in the specification.

6 Claims, 3 Drawing Sheets

ERROR CORRECTION ENCODING APPARATUS, ERROR CORRECTION DECODING APPARATUS, NONVOLATILE SEMICONDUCTOR MEMORY SYSTEM, AND PARITY CHECK MATRIX GENERATION METHOD

CROSS-REFERENCE TO RELATED APPLICATIONS

This application is based upon and claims the benefit of priority from prior Japanese Patent Application No. 2011-182633, filed Aug. 24, 2011, the entire contents of which are incorporated herein by reference.

FIELD

Embodiments described herein relate generally to an error correction code.

BACKGROUND

A low-density parity check (LDPC) code is known as a type of error correction code. The LDPC code has a strong error correcting capability. However, the LPDC code has a relatively short minimum distance between code words. Thus, even a small number of errors in encoded data to be decoded may cause erroneous corrections at a certain probability. The erroneous correction means a failure to accurately detect errors contained in encoded data, with the result that code words obtained are erroneous. Thus, decoded data output by an LDPC decoder may contain errors.

DETAILED DESCRIPTION

An embodiment will be described below with reference to the drawings.

In general, according to one embodiment, an error correction encoding apparatus includes a linear encoder and a low-density parity check (LDPC) encoder. The linear encoder supports a linear coding scheme enabling a parity check to be carried out by a division using a generating polynomial and applies the generating polynomial to input data to obtain linear coded data. The LDPC encoder applies a generator matrix corresponding to a parity check matrix for an LDPC code to the linear coded data to obtain output data. The parity check matrix satisfies Expression (1) shown in the specification.

In the description below, the terms "decode" and "correct" are often used but both have generally the same meaning. Specifically, both terms mean estimation of correct code frames (code data), that is, have generally the same meaning as error corrections.

(First Embodiment)

An error correction encoding apparatus and an error correction decoding apparatus according to a first embodiment are incorporated into, for example, a memory system and a communication system. In the description below, for simplification, it is assumed that the error correction encoding apparatus and the error correction decoding apparatus according to the present embodiment are incorporated into a nonvolatile semiconductor memory system. However, the error correction encoding apparatus and the error correction decoding apparatus according to the present embodiment may be applied to any system for which an error correction code can be utilized, such as a communication system, an optical memory system, and a magnetic memory system.

Figure 1:
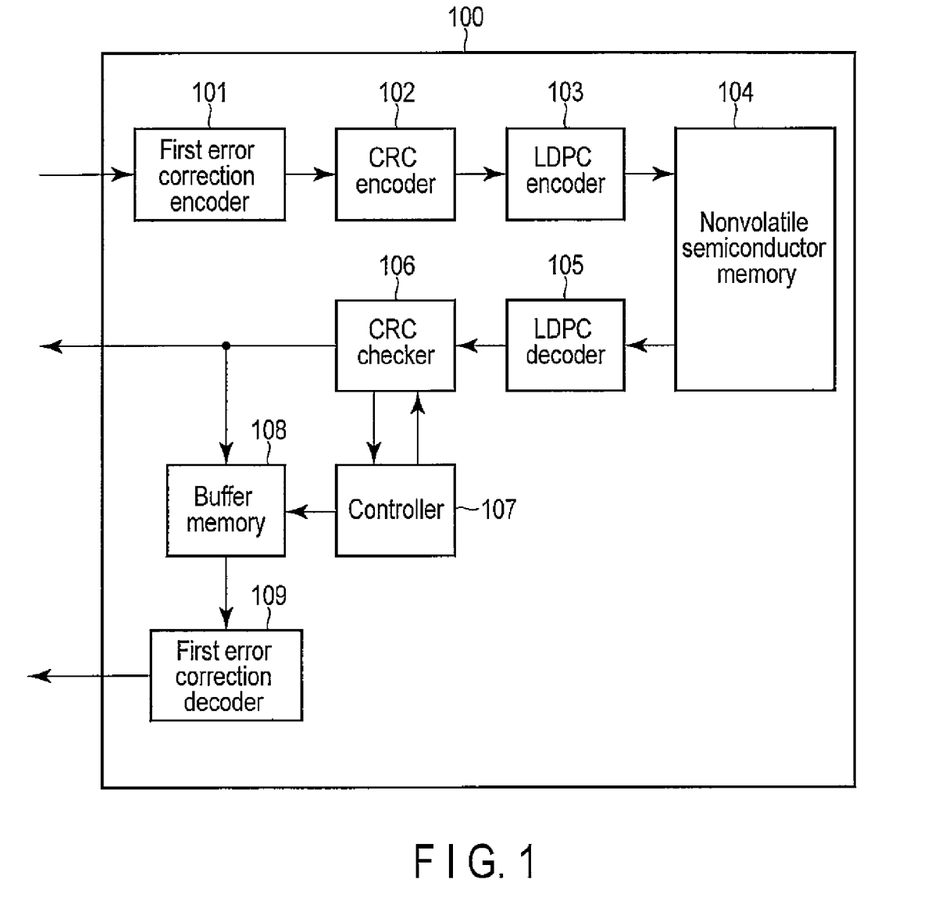
FIG. 1 is a block diagram illustrating a nonvolatile semiconductor memory system including a error correction encoding apparatus and an error correction decoding apparatus according to a first embodiment.

The error correction encoding apparatus and the error correction decoding apparatus according to the present embodiment are incorporated into a nonvolatile semiconductor memory system 100 shown in, for example, FIG. 1. A nonvolatile semiconductor memory system 100 includes a first error correction encoder 101, a cyclic redundancy check (CRC) encoder 102, an LDPC encoder 103, a nonvolatile semiconductor memory 104, an LDPC decoder 105, a CRC checker 106, a controller 107, a buffer memory 108, and a first error correction decoder 109.

Here, the error correction encoding apparatus according to the present embodiment includes, for example, the first error correction encoder 101, the CRC encoder 102, and then LDPC encoder 103. Furthermore, the error correction decoding apparatus according to the present embodiment includes the LDPC decoder 105, the CRC checker 106, the controller 107, the buffer memory 108, and the first error correction decoder 109.

Figure 2:
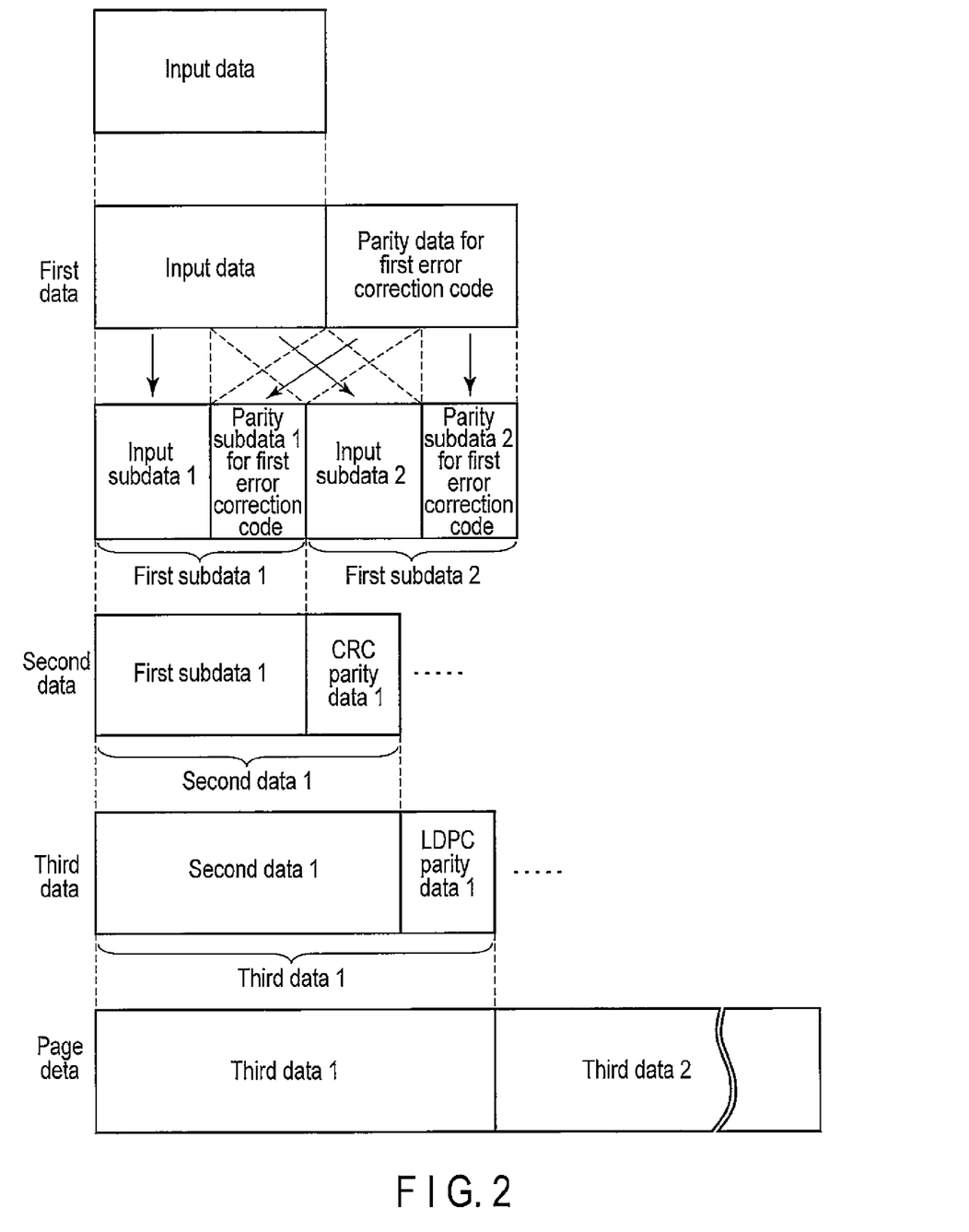
FIG. 2 is a diagram illustrating data generated by functional units in the error correction encoding apparatus according to a first embodiment.

As shown in FIG. 2, the first error correction encoder 101 adds parity data based on a first error correction code to data input to the nonvolatile semiconductor memory system 100 to obtain first data. The first error correction encoder 101 outputs the data to the CRC encoder 102.

The first error correction code may be an error correction code of any type. The first error correction code is utilized to decode correct data when decoding by the LDPC decoder 105, which will be described below, fails (for example, when an error floor occurs) or when the CRC checker 106 detects an error. However, the first error correction code is not always used. The first error correction encoder 101 and the first error correction decoder 109 may be removed as needed.

As shown in FIG. 2, the CRC encoder 102 divides first data into M sets of first subdata 1, . . . , M. In FIG. 2, M=2. However, the division is not always performed. That is, M=1 is allowed and thus M≥1. Furthermore, in FIG. 2, in the first data, each of a data portion and a parity data portion is equally divided. However, one or both of the data portions may be unequally divided. Alternatively, the first data may be equally or unequally divided in order starting with the leading portion. In the description below, for simplification, the division scheme illustrated in FIG. 2 is assumed. Such a division scheme matches a division scheme for a known nonvolatile semiconductor system.

Moreover, as shown in FIG. 2, the CRC encoder 102 adds M sets of CRC parity data 1, . . . , M to M sets of first subdata 1, . . . , M to obtain M sets of second subdata 1, . . . , M. Typically, the CRC encoder 102 divides the first subdata by a generating polynomial, and adds the remainder to the first subdata as parity data. The CRC encoder 102 outputs M sets of second data 1, . . . , M to the LDPC encoder 103.

The CRC encoder 102 may be replaced with a linear encoder that supports any linear coding scheme enabling parity checks based on the division using the generating polynomial. The linear coding scheme has at least an error detection capability but may further have an error correction capability. Specifically, the linear coding scheme may be a Hamming code, a BCH code, a Reed-Solomon code, or the like.

As shown in FIG. 2, the LDPC encoder 103 adds M sets of parity data 1, . . . , M to M sets of second data 1, . . . , M to obtain third sets of data 1, . . . , M. Typically, the LDPC encoder 103 multiplies the second data by a generator matrix corresponding to a parity check matrix of an LDPC code to obtain third data. The parity check matrix will be described below in detail. The LDPC encoder 103 outputs M sets of third data 1, . . . , M to the nonvolatile semiconductor memory 104.

The nonvolatile semiconductor memory 104 is implemented by a flash memory comprising an array structure with a plurality of memory cells connected together in NAND form. The nonvolatile semiconductor memory 104 records the M sets of third data 1, . . . , M in the memory cells. Specifically, the nonvolatile semiconductor memory 104 writes and reads data in page data units. The capacity of page data is about several kilobytes but depends on the configuration of the flash memory. As shown in FIG. 2, one page data unit can contain at least all of the M sets of third data 1, . . . , M. The configuration of the nonvolatile semiconductor memory system 100 shown in FIG. 1 is simplified. However, of course, the nonvolatile semiconductor memory system 100 reasonably comprises various functional units (not shown in the drawings) required to write and read data to and from the flash memory.

At least two writing threshold voltages are set for each of the memory cells. Data of at least one bit can be stored depending on the number of threshold voltages. For example, if two bits are stored in one memory cell, two-bit values 11, 10, 01, and 00 are mapped to the respective four threshold voltages. The threshold voltages for the memory cell may be caused to fluctuate by capacitive coupling with adjacent cells or the like. The fluctuation of the threshold voltages may lead to errors in read data.

The components for data writing and the operation thereof have been described. Components for data reading and the operation thereof will be described below.

M sets of fourth data 1, . . . , M are read from the nonvolatile semiconductor memory 104 and output to the LDPC decoder 105. As described above, the M sets of fourth data 1, . . . , M may contain errors. That is, the M sets of fourth data 1, . . . , M do not always match M sets of third data 1, . . . , M.

The LDPC decoder 105 carries out an LDPC decoding process on the M sets of fourth data 1, . . . , M Specifically, the LDPC decoder 105 implements an iterative decoding algorithm using a parity check matrix described below. The iterative decoding algorithm is, for example, a sum-product algorithm or a min-sum algorithm. During each trial of iterative decoding, the LDPC decoder 105 carries out a parity check by multiplying temporary estimated words in the fourth data by a parity check matrix. If LDPC code words are obtained (that is, the decoding succeeds) during the iterative decoding, the LDPC decoder 105 removes parity data for an LDPC code from the LDPC code words and outputs resultant M sets of fifth data 1, . . . , M to the CRC checker 106. The M sets of fifth data 1, . . . , M correspond to data portions of the LDPC code words. However, the LDPC code words may be accurately or erroneously corrected.

On the other hand, the LDPC decoder 105 may fail to obtain LDPC code words (that is, may fail in decoding) even though the number of trials of iterative decoding reaches the maximum value. A manner to deal with such a case is not particularly limited. However, it can be assumed that, for example, decoding based on the first error correction code is carried out with CRC checks omitted.

The CRC checker 106 carries out CRC checks on the M sets of fifth data 1, . . . , M. Specifically, the fifth data is divided by a generating polynomial and checks whether or not the remainder is zero. If the remainder is zero, no error is detected in the fifth data. If the remainder is nonzero, an error is detected in the fifth data. The CRC checker 106 notifies the controller 107 of check results (that is, whether or not an error has been detected) 1, . . . , M for the M sets of fifth data 1, . . . , M. Furthermore, the CRC checker 106 removes CRC parity data from the M sets of fifth data 1, . . . , M to obtain M sets of sixth data 1, . . . , M. The CRC checker 106 saves M sets of sixth data 1, . . . , M to the buffer memory 108. Moreover, the CRC checker 106 may remove parity subdata for the first error correction code from sixth data with no error detected therein and output the resultant data to an exterior. Such a measure allows omission of a decoding process otherwise carried out on the sixth data with no error by the first error correction decoder 109. This improves data output throughput.

The controller 107 refers the check results 1, . . . , M from the CRC checker 106 to check whether or not an error has been detected in at least one sixth data. If an error has been detected in at least one sixth data, the controller 107 instructs the buffer memory 108 to output the M sets of sixth data 1, . . . , M. The controller 107 also instructs the first error correction decoder 109 to carry out a decoding process. The controller 107 may further notify the first error correction decoder 109 of the check results 1, . . . , M from the CRC checker 106. Such a measure allows the first error correction decoder 109 to identify sixth data with no error contained therein, allowing unwanted decoding processes to be omitted. That is, compared to the case where all of the sixth data 1, . . . , M are processed, the measure allows the decoding process by the first error correction decoder 109 to be sped up.

The buffer memory 108 saves the M sets of sixth data 1, . . . , M from the CRC checker 106. When provided with an output instruction by the controller 107, the buffer memory 108 outputs seventh data to the first error correction decoder 109. The seventh data is obtained by coupling the M sets of sixth data 1, . . . , M together. Upon receiving an instruction to carry out a decoding process, from the controller 107, the first error correction decoder 109 performs a decoding process on the seventh data from the buffer memory 108 based on the first error correction code. As described above, the first error correction decoder 109 may utilize the CRC check results 1, . . . , M of which the controller 107 notifies the first error correction decoder 109, to carry out an efficient decoding process. Upon obtaining code words as a result of the decoding process on the seventh data (that is, the error has been corrected), the first error correction decoder 109 removes the parity data for the first error correction code from the code words and then outputs the resultant data to the exterior. On the other hand, if no code word has been obtained as a result of the decoding process (the error has not been corrected), a measure to deal with this case is not particularly limited. For example, the data containing the error may or may not be output to the exterior. In either way, information enabling confirmation of a failure to correct the error is desirably output to the exterior.

As described above, in the nonvolatile semiconductor memory system 100, the LDPC decoder 105 and the CRC checker 106 carry out dual error detection. That is, a CRC code (or any other outer code) may be combined with the LDPC code in order to allow erroneously corrected LDPC code words to be detected. The use of the CRC code enables errors in erroneously corrected LDPC decoded data to be detected.

However, LDPC decoded data based on erroneous corrections may accidentally match CRC code words depending on the design of the LDPC code. In this case, the CRC code as an outer code fails to function, preventing errors from being detected. That is, even a simple combination of the CRC code with the LDPC code does not easily improve the error detection rate of the whole system (for example, a memory system utilizing the LDPC code or a communication system). For example, if the fifth data based on the code words erroneously corrected by the LDPC decoder 105 matches the CRC code words, the CRC checker 106 fails to function. This precludes errors contained in the fifth data from being detected.

Thus, the error correction decoding apparatus according to the present embodiment uses a parity check matrix for the LDPC code which satisfies Expression (1). The error correction encoding apparatus according to the present embodiment also uses an LDPC code generator matrix corresponding to the parity check matrix.

In general, the Hamming distance between an accurately corrected LDPC code word (for convenience, referred to as a first LDPC code word) and the erroneously corrected LDPC code word (for convenience, referred to as a second LDPC code word) is likely to be short. Furthermore, the LDPC code one of linear codes and thus the distance between the code words is also an LDPC code word (for convenience, referred to as a third LDPC code word). The likelihood of an erroneous correction increases with decreasing distance between code words. Hence, the third LDPC code word tends to be a low weight code word comprising a small number of ones and a large number of zeros. Here, it is assumed that the first LDPC code word comprises only zeros. Then, the second LPDC code word matches the third LDPC code word. That is, under this assumption, the second LDPC code word is likely to be a low weight code word. If the LDPC code is designed such that CRC code word does not match the fifth data (which may be a low weight code sequence) obtained by removing the parity data for the LDPC code from the low weight code word (such that CRC check is not passed), the CRC checker 106 can detect an error in the fifth data based on the erroneous correction of the LDPC code word comprising only zeros.

Moreover, the CRC code is also one of linear codes. That is, the distance between any two CRC code words matches a CRC code word. Hence, preventing the low weight code sequence from matching the CRC code word means preventing a match between the CRC code word and a code sequence (obtained by removing the LDPC parity data from the second LDPC code word) in which the distance from any CRC code word (a code sequence obtained by removing the parity data for the LDPC code from the first LDPC code word) equals the low weight code sequence. Thus, with the LPDC code designed such that the CRC code word does not match the fifth data obtained by removing the parity data for the LDPC code from the low weight LDPC code word, the CRC checker 106 can accurately detect erroneous corrections carried out by the LDPC decoder 105. To meet such conditions, the parity check matrix for the LDPC code needs to satisfy:

$$R\left(\frac{d(x)}{g(x)}\right) \neq 0 \quad (1)$$

and in this case, $$D(x) = \sum_{\substack{i \in S \setminus P \\ |S| = J+1}} \tilde{c}_i(x) x^{qi} = \sum_{\substack{i \in S \setminus P \\ |S| = J+1}} perm(H_{S \setminus i}) x^{qi},$$

where g(x): a generating polynomial for a linear code (for example, the CRC code),
d(x): a sequence polynomial expressing the data portion of the low weight LDPC code word, $$R\left(\frac{d(x)}{g(x)}\right):$$

remainder of $$\frac{d(x)}{g(x)},$$

H: a parity check matrix of J rows by K columns, comprising a plurality of elements corresponding to q–1$^{th}$ order polynomials,
q: a block size used when H is expanded into a binary form,
S: a set of column indices optionally extracted from H,
|S|: size of S,
P: a set of column indices corresponding to the parity portion of H,
$H_S$: a sub-matrix comprising the column vectors of H which are contained in S
S\i: a set of the column indices in S other than a column index=i,
$\tilde{c}_i(x)$: a polynomial expressing an element of the low weight code word which corresponds to the column index=i, and
perm( ): a function meaning a calculation of a determinant on a binary polynomial ring.

Expression (1) described above expresses conditions under which the data portion (=d(x)) of the low weight LDPC code word based on the parity check matrix (=H) for the LDPC code is determined by the CRC checker 106 to be a CRC error. That is, if the parity check matrix (=H) for the LDPC code satisfies Expression (1) described above, an error contained in the erroneously corrected LDPC code word is detected by the CRC checker 106 at a high probability.

More specifically, the parity check matrix (=H) is formed by combining a plurality of q×q blocks together. Each block is a q×q cyclic shift matrix (a matrix obtained by cyclically shifting a unit matrix) or a q×q zero matrix. The LDPC code based on the parity check matrix (=H) is referred to as a semi-cyclic LDPC code. Each block is not limited to the binary expression but can be expressed by a q–1$^{th}$ order polynomial. For example, a polynomial expression can be provided by setting an element in the first row and first column of each block to be a coefficient for $X^0$=1 and setting an element in the q$^{th}$ row and first column of each block to be a coefficient for $x^{q-1}$. Thus, the parity check matrix (=H) can be expressed as a J×K matrix with elements corresponding to q–1$^{th}$ order polynomials as shown by:

$$H = \begin{bmatrix} h_{1,1}(x) & \cdots & h_{1,K}(x) \\ \vdots & \ddots & \vdots \\ h_{J,1}(x) & \cdots & h_{J,K}(x) \end{bmatrix} \quad (2)$$

Moreover, the code word (=c) can also be expressed by $q-1^{th}$ order polynomials in every q columns. Specifically, a polynomial expression can be provided by assigning, for every q columns, elements with respective column indices as coefficients for $X^0, \ldots, x^{q-1}$ in order of increasing column index. Thus, the code word (=c) can be expressed as a row vector with K $q-1^{th}$ order polynomials as elements as shown in:

$$c = (c_1(x), c_2(x), \ldots, c_K(x)) \quad (3)$$

Figure 3:
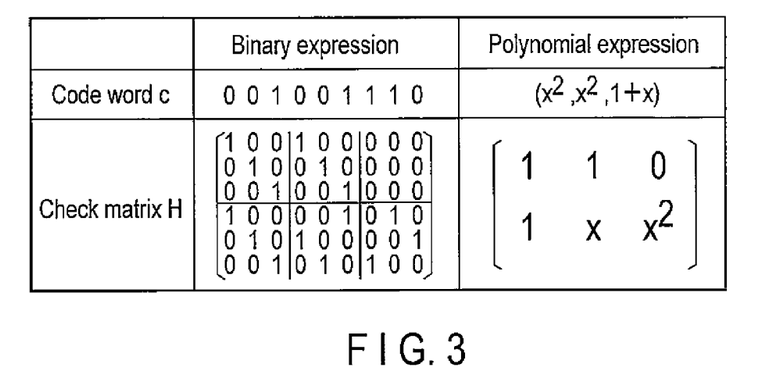
FIG. 3 is a diagram illustrating a binary form and a polynomial form of a parity check matrix and code words for an LDPC code.

FIG. 3 shows, by way of example, a polynomial expression and a binary expression of a code word (=c) and a parity check matrix (=H) for q=3, J=2, and K=3. The polynomial expression of the code word is not limited to the example in FIG. 3 but may be $d'(x) = x^n d(x^{-1})$, which is corresponding to reversing the order of the polynomial.

Moreover, as shown below in Expression (4), a parity check on the LDPC code may be expressed by a polynomial. Expression (4) shown below indicates a parity check on the $j^{th}$ row.

$$s_j(x) = \sum_{i \in \{1 \ldots K\}} h_{j,i}(x) c_i(x) \quad (4)$$

A polynomial vector (=c) is a code word defined by a parity check matrix (=H). Thus, all of $s_j(x)$ (j=1, ..., J) are zero. That is, in Expression (4) shown above, if $s_j(x)=0$ for all js when a polynomial expression $c_i(x)$ is provided for each of the elements of a temporary estimated word, the temporary estimated word is determined to be an LDPC code word. On the other hand, if $s_j(x)$ is not zero for at least one j, the temporary estimated word is determined not to be an LDPC code word.

The low weight code sequence can be defined by Expression (5) shown below. The fact that the low weight code sequence can be defined by Expression (5) can be understood with reference to R. Smarandache et al. "Quasi-Cyclic LDPC Codes: Influence of Proto- and Tranner-Graph Structure on Minimum Hamming Distance Upper Bounds," arXiv: 0901.4129v1. Thus, the details of the definition are omitted.

$$\tilde{c} = (\tilde{c}_1(x), \tilde{c}_2(x), \ldots, \tilde{c}_K(x)) \quad (5)$$

In this case, $$\tilde{c}_i(x) = \begin{cases} perm(H_{Si}) & i \in S, |S| = J+1 \\ 0 & \text{otherwise} \end{cases}$$

The low weight code sequence is an LDPC code word satisfying parity checks in the LDPC decoder 105 as proved below. Based on Expressions (4) and (5) shown above, the parity check on the low weight code sequence can be expressed by:

$$s_j(x) = \sum_{i \in S} h_{j,i}(x) \tilde{c}_i(x) \quad (6)$$
$$= \sum_{i \in S} h_{j,i}(x) perm(H_{Si})$$

Here, the function perm( ) means a calculation of a determinant. Thus, Expression (6) shown above may be considered to be a cofactor expansion of the matrix:

$$\begin{bmatrix} h_{j,i_1}(x) & h_{j,i_2}(x) & \cdots & h_{j,i_{J+1}}(x) \\ h_{1,i_1}(x) & h_{1,i_2}(x) & \cdots & h_{1,i_{J+1}}(x) \\ \vdots & \vdots & \ddots & \vdots \\ h_{J,i_1}(x) & h_{J,i_2}(x) & \cdots & h_{J,i_{J+1}}(x) \end{bmatrix}$$

In the above-described matrix, the first row inevitably matches the $j+1^{th}$ row. Hence, the matrix is not of a full rank. That is, the determinant inevitably becomes zero, and $s_j(x)=0$ for all js. Thus, the low weight code sequence shown above in Expression (5) satisfies the parity check in the LDPC decoder 105. Then, as described above, the CRC checker 106 can detect errors in the data portion of the low weight LDPC code word.

A method for generating a parity check matrix for an LDPC code satisfying Expression (1) will be described with reference to FIG. 4. Satisfaction of Expression (1) by the parity check matrix for the LDPC code word can be ensured by applying an algorithm corresponding to the method during design of the error correction encoding apparatus and the error correction decoding apparatus. In the algorithm illustrated in FIG. 4, for simplification, a parity check matrix (=H) is to be generated which has a column order increasing with decreasing column index (in other words, the column order decreases with increasing column index).

First, various parameters are input. Specifically, the numbers of rows (=J) and columns (=K) in the parity check matrix (=H), and a nonzero block distribution (=D(k)) are input; the nonzero block distribution indicates the total number of nonzero blocks contained in the $k^{th}$ column. Moreover, as an initialization process, K is substituted into a variable i. Furthermore, 1 is substituted into a variable e. After the initialization, the process advances to step S201.

In step S201, the process determines whether or not i is a positive value. If i is a positive value, the process advances to step S202. Otherwise the process advances to step S205. In step S205, a parity check matrix H verified to satisfy Expression (1) has already been generated and is thus output. The process thus ends.

In step S202, the process determines whether or not e is smaller than D(i). If e is smaller than D(i), the process advances to step S203. Otherwise the process advances to step S204.

In step S203, an algorithm such as PEG (Progressive Edge Growth) is used to determine a polynomial $h_{j\_e,i}(x)$. PEG is described in detail in D. Arnold et al. "Progressive Edge-growth Tanner Graphs," GLOBECOM 2001. Thus, the details of PEG are omitted herein. Moreover, e is incremented by one (e=e+1), and the process returns to step S202.

In step S204, the process determines whether or not $H_{\{i, \ldots, K\}}$, which is a candidate (for the $i^{th}$ row to the $K^{th}$ row) for the parity check matrix, satisfies Expression (1). If $H_{\{i, \ldots, K\}}$ satisfies Expression (1), the process advances to step S206. Otherwise the process advances to step S207.

In step S206, i is decremented by one (i=i−1), and the process returns to step S201. In step S207, 1 is substituted into e, and the process returns to step S203.

Figure 4:
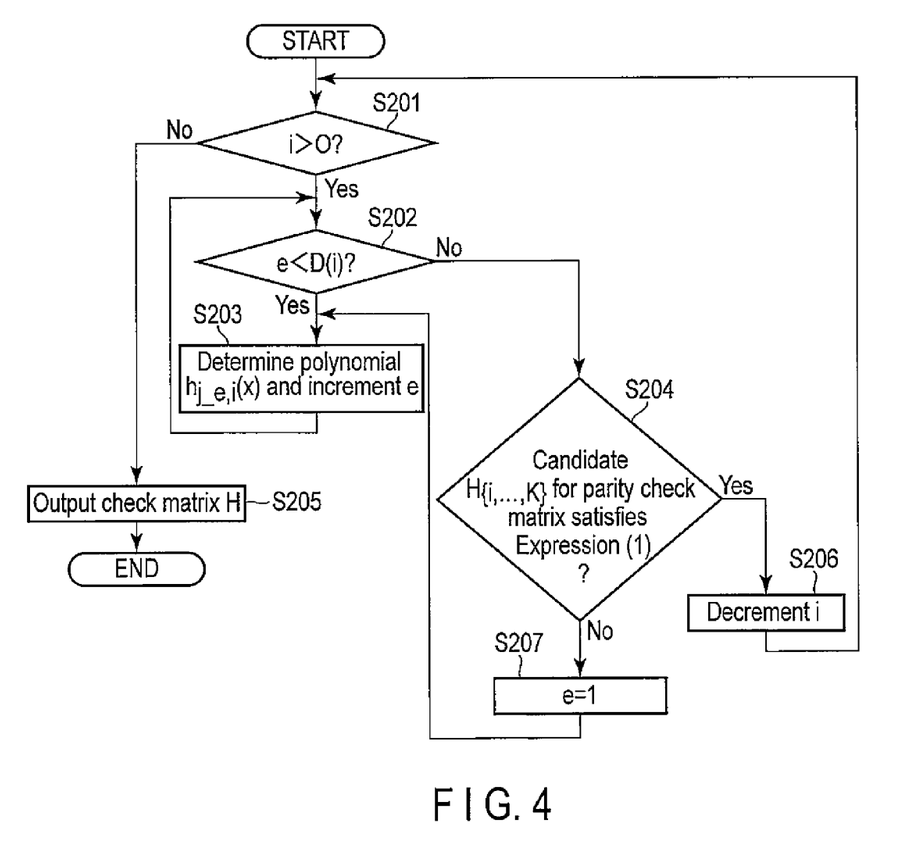
FIG. 4 is a flowchart illustrating a method for generating a parity check matrix according to the first embodiment.

According to the algorithm illustrated in FIG. 4, from the Kth column to first column of the parity check matrix (=H), a candidate for polynomial elements of a target column ($i^{th}$ column) is created. The process determines whether or not a parity check matrix based on the target satisfies Expression (1). If Expression (1) is satisfied, the polynomial elements of the target column ($i^{th}$ column) is determined. Otherwise, a new candidate for the polynomial elements of the target column is created. The method for generating a parity check matrix (=H) is not limited to the example illustrated in FIG. 4. Any appropriate method may be used provided that the generated parity check matrix (=H) can be verified to satisfy Expression (1).

As described above, the error correction encoding apparatus and the error correction encoding apparatus according to the first embodiment carry out LDPC encoding and LDPC decoding based on a parity check matrix for an LDPC code which satisfies Expression (1) in combination with a CRC code. Thus, according to the error correction encoding apparatus and the error correction encoding apparatus according to the first embodiment, the data portion of the low weight LDPC code word does not match a CRC code word. Therefore, even if LDPC decoding results in an erroneous correction, CRC checks allow errors to be detected at a high probability.

The processing in the above-described embodiments can be implemented using a general-purpose computer as basic hardware. A program implementing the processing in each of the above-described embodiments may be stored in a computer readable storage medium for provision. The program is stored in the storage medium as a file in an installable or executable format. The storage medium is a magnetic disk, an optical disc (CD-ROM, CD-R, DVD, or the like), a magnetooptic disc (MO or the like), a semiconductor disk, or the like. That is, the storage medium may be in any format provided that a program can be stored in the storage medium and that a computer can read the program from the storage medium. Furthermore, the program implementing the processing in each of the above-described embodiments may be stored on a computer (server) connected to a network such as the Internet so as to be downloaded into a computer (client) via the network.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An error correction encoding apparatus, comprising:
a linear encoder configured to support a linear coding scheme enabling a parity check to be carried out by a division using a generating polynomial and to apply the generating polynomial to input data to obtain linear coded data; and
a low-density parity check (LDPC) encoder configured to apply a generator matrix corresponding to a parity check matrix for an LDPC code to the linear coded data to obtain output data, and wherein the parity check matrix satisfies an expression:

$$R\left(\frac{d(x)}{g(x)}\right) \neq 0,$$

and in this case, $$d(x) = \sum_{\substack{i \in S \setminus P \\ |S|=J+1}} \tilde{c}_i(x) x^{qi} = \sum_{\substack{i \in S \setminus P \\ |S|=J+1}} perm(H_{S \setminus i}) x^{qi},$$

where g(x): the generating polynomial,
d(x): a sequence polynomial expressing a data portion of a low weight LDPC code word, $$R\left(\frac{d(x)}{g(x)}\right):$$

a remainder of $$\frac{d(x)}{g(x)},$$

H: the parity check matrix of J rows by K columns, comprising elements corresponding to q−$1^{th}$ order polynomials,
q: a block size used when H is expanded into a binary form,
S: a set of column indices optionally extracted from H,
|S|: a size of S,
P: a set of column indices corresponding to a parity portion of H,
$H_S$: a sub-matrix comprising column vectors of H which are contained in S,
S\i: a set of column indices in S other than a column index=i,
$\tilde{c}_i(x)$: a polynomial expressing an element of the low weight code word which corresponds to the column index=i, and
perm( ): a function meaning a calculation of a determinant on a binary polynomial ring.

2. An error correction decoding apparatus, comprising:
a low-density parity check (LDPC) decoder configured to decode input data using a parity check matrix for an LDPC code to obtain LDPC decoded data; and
an error checker configured to support a linear coding scheme enabling a parity check to be carried out by a division using a generating polynomial and to check the LDPC decoded data for an error by applying the generating polynomial to the LDPC decoded data to obtain output data, and wherein the parity check matrix satisfies an expression:

$$R\left(\frac{d(x)}{g(x)}\right) \neq 0,$$

and in this case, $$d(x) = \sum_{\substack{i \in S \setminus P \\ |S|=J+1}} \tilde{c}_i(x) x^{qi} = \sum_{\substack{i \in S \setminus P \\ |S|=J+1}} perm(H_{S \setminus i}) x^{qi},$$

where g(x): the generating polynomial,
d(x): a sequence polynomial expressing a data portion of a low weight LDPC code word, $$R\left(\frac{d(x)}{g(x)}\right):$$

a remainder of $$\frac{d(x)}{g(x)},$$

H: the parity check matrix of J rows by K columns, comprising elements corresponding to q–1$^{th}$ order polynomials,
q: a block size used when H is expanded into a binary form,
S: a set of column indices optionally extracted from H,
|S|: a size of S,
P: a set of column indices corresponding to a parity portion of H,
$H_S$: a sub-matrix comprising column vectors of H which are contained in S,
S\i: a set of column indices in S other than a column index=i,
$\tilde{c}_i(x)$: a polynomial expressing an element of the low weight code word which corresponds to the column index=i, and
perm( ): a function meaning a calculation of a determinant on a binary polynomial ring.

3. A nonvolatile semiconductor memory system, comprising:
  a linear encoder configured to support a linear coding scheme enabling a parity check to be carried out by a division using a generating polynomial and to apply the generating polynomial to first data to obtain second data;
  a low-density parity check (LDPC) encoder configured to apply a generator matrix corresponding to a parity check matrix for an LDPC code to the second data to obtain third data;
  a nonvolatile semiconductor memory configured to store the third data;
  an LDPC decoder configured to read the third data from the nonvolatile semiconductor memory to obtain fourth data and to decode the fourth data using the parity check matrix to obtain fifth data; and
  an error checker configured to support the linear coding scheme and to check the fifth data for an error by applying the generating polynomial to the fifth data to obtain sixth data, and wherein the parity check matrix satisfies an expression:

$$R\left(\frac{d(x)}{g(x)}\right) \neq 0,$$

and in this case, $$d(x) = \sum_{\substack{i \in S\backslash P \\ |S|=J+1}} \tilde{c}_i(x) x^{qi} = \sum_{\substack{i \in S\backslash P \\ |S|=J+1}} perm(H_{S\backslash i}) x^{qi},$$

where g(x): the generating polynomial,
d(x): a sequence polynomial expressing a data portion of a low weight LDPC code word, $$R\left(\frac{d(x)}{g(x)}\right):$$

a remainder of $$\frac{d(x)}{g(x)},$$

H: the parity check matrix of J rows by K columns, comprising elements corresponding to q–1$^{th}$ order polynomials,
q: a block size used when H is expanded into a binary form,
S: a set of column indices optionally extracted from H,
|S|: a size of S,
P: a set of column indices corresponding to a parity portion of H,
$H_S$: a sub-matrix comprising column vectors of H which are contained in S,
S\i: a set of column indices in S other than a column index=i,
$\tilde{c}_i(x)$: a polynomial expressing an element of the low weight code word which corresponds to the column index=i, and
perm( ): a function meaning a calculation of a determinant on a binary polynomial ring.

4. The system according to claim 3, further comprising:
  a first error correction encoder configured to encode input data based on a first error correction coding scheme to obtain the first data; and
  a first error correction decoder configured to decode the sixth data based on the first error correction coding scheme to obtain output data.

5. The system according to claim 3, wherein the parity check matrix has been verified to satisfy the expression during design.

6. A parity check matrix generating method, comprising:
  creating a candidate for a parity check matrix for an LDPC code utilized in combination with a linear coding scheme enabling a parity check to be carried out by a division using a generating polynomial;
  determining whether or not the candidate for the parity check matrix satisfies an expression:

$$R\left(\frac{d(x)}{g(x)}\right) \neq 0,$$

and in this case, $$d(x) = \sum_{\substack{i \in S\backslash P \\ |S|=J+1}} \tilde{c}_i(x) x^{qi} = \sum_{\substack{i \in S\backslash P \\ |S|=J+1}} perm(H_{S\backslash i}) x^{qi},$$

where g(x): the generating polynomial,
d(x): a sequence polynomial expressing a data portion of a low weight LDPC code word, $$R\left(\frac{d(x)}{g(x)}\right):$$

a remainder of $$\frac{d(x)}{g(x)},$$

H: the candidate for the parity check matrix of J rows by K columns, comprising elements corresponding to q−1$^{th}$ order polynomials,
  q: a block size used when H is expanded into a binary form,
  S: a set of column indices optionally extracted from H,
  |S|: a size of S,
  P: a set of column indices corresponding to a parity portion of H,
  $H_S$: a sub-matrix comprising column vectors of H which are contained in S,
  S\i: a set of column indices in S other than a column index=i,
  $\tilde{c}_i(x)$: a polynomial expressing an element of the low weight code word which corresponds to the column index=i, and
  perm( ): a function meaning a calculation of a determinant on a binary polynomial ring; and
determining the candidate for the parity check matrix to be a parity check matrix if the candidate for the parity check matrix satisfies the expression, and wherein creating the candidate for the parity check matrix and determining whether or not the candidate for the parity check matrix satisfies the expression are iterated until the candidate for the parity check matrix satisfies the expression.

* * * * *